United States Patent [19]

Uchikoshi

[11] Patent Number: 4,536,743
[45] Date of Patent: Aug. 20, 1985

[54] METHOD OF CONVERTING A DIGITAL SIGNAL INTO AN ANALOG SIGNAL AND A DIGITAL-TO-ANALOG CONVERTER THEREFOR

[75] Inventor: Gohji Uchikoshi, Higashimurayama, Japan

[73] Assignee: Nakamichi Corporation, Tokyo, Japan

[21] Appl. No.: 406,214

[22] Filed: Aug. 9, 1982

[30] Foreign Application Priority Data

Aug. 14, 1981 [JP] Japan .......................... 56-127457[U]

[51] Int. Cl.³ ............................................ H03K 13/02
[52] U.S. Cl. ............................ 340/347 DA; 307/265; 328/129.1; 328/130.1; 328/160; 364/606
[58] Field of Search ................ 340/347 DA, 347 CC, 340/347 M; 377/42; 364/606; 307/265; 328/129.1, 130.1, 160

[56] References Cited

U.S. PATENT DOCUMENTS 4,209,775 6/1980 Kawashima et al. ............ 455/179 X

Primary Examiner—T. J. Sloyan
Attorney, Agent, or Firm—Pearne, Gordon, Sessions, McCoy, Granger & Tilberry

[57] ABSTRACT

In the invention, a digital signal consisting of upper and lower bits is sampled while the upper and lower bits are divided. The sampled digital signal components of upper and lower bits are converted into upper and lower pulse width signals having a pulse width responding to their data value, respectively. Thereafter, the upper and lower pulse width signals are mixed and pass through a smoothing filter to convert the digital signal into an analog signal. The upper pulse width signal is formed of a pulse signal varying in a pulse width in response to the data value of the upper bits relative to a center of pulse width which has a fixed time position within a sampling period. The lower pulse width signal is formed of a combination of pulse signals varying in each pulse width in response to the data value of the lower bits relative to each center of pulse width which is at each pulse edge of the upper pulse width signal.

3 Claims, 5 Drawing Figures

METHOD OF CONVERTING A DIGITAL SIGNAL INTO AN ANALOG SIGNAL AND A DIGITAL-TO-ANALOG CONVERTER THEREFOR

BACKGROUND OF THE INVENTION

There has been proposed a method in which an input digital signal is converted into a corresponding analog signal by filtering a pulse width signal, the pulse width of which depends on a data value of the input digital signal. This method has an advantage of obtaining a high precision of conversion without using any high precision components in a converting circuit. However, if the pulse width signal is improperly produced, there tends to be produced a distortion in a range of high frequency even though the pulse width corresponding to the data value is precisely formed. Also, if the number of bits of the digital signal to be converted increases, the speed of conversion becomes disadvantageously lower.

More particularly, in the prior art, when the input digital signal is converted into the pulse width signal, the pulse width of the pulse width signal is determined on a time interval from the sampling time so that the center of the pulse width of the pulse width signal varies within a sampling period in accordance with the data value of the sampled input digital signal. Therefore, the waveform of the demodulated analog signal through the filter is extended in the portion in which a level increases, in comparison to the corresponding portion of the original analog signal, while it is compressed in the portion in which a level decreases, in comparison to the corresponding portion of the original analog signal. Thus, it will be noted that the waveform of the demodulated analog signal differs from that of the original analog signal, particularly in the range of high frequency.

In order to solve the problem of speed of conversion, there will be considered a method in which a digital signal consists of a combination of upper and lower bits which are divided and processed in parallel with each other in a digital-to-pulse width conversion. The weight ratio between both upper and lower bits is a predetermined value, with the upper bits having a much greater weight of data value of the digital signal. In the digital-to-pulse width conversion of such digital signal, the upper and lower bits are converted into upper and lower pulse width signals, respectively. Thereafter both pulse width signals are mixed after attenuating the lower pulse width signal in accordance with the weight ratio. However, in the digital signal consisting of upper and lower bits, there occurs a moving up from the lower bits to the upper bits or a moving down from the upper bits to the lower bits when the data value of the digital signal increases or decreases, respectively. If an appearing or disappearing time of an increasing or a decreasing portion of the pulse width of the upper pulse width signal due to the moving up or down has an improper relation to a center of the lower pulse width signal disappeared or appeared due to the moving up and down, there will occur a distortion or noise. FIG. 1 shows an occurrence in the distortion when there occurs the moving up to the upper bits. As shown in FIG. 1A, when the moving up to the upper bits occurs, the upper pulse width signal a has a respective increased area of Sa at both ends of the pulse signal while the lower pulse width signal b, which is given the predetermined attenuation disappears. In fact, the increased pulse area of 2Sa is larger by the area corresponding to the minimum unit of the lower pulse width signal that the decreased pulse area of 2Sb in the lower pulse width signal b, but both of the areas 2Sa and 2Sb will be considered to be equal to each other for brief description. As shown in FIG. 1B, when the moving up occurs, pulses a' corresponding to each pulse area of Sa and negative pulses b' of the lower pulse width signal b are considered to be generated while the upper and lower pulse width signals a and b are as they are. Determining the frequency characteristics of the pulses a' and b' by the Fourier analysis, the areas of the pulses a' and b' are equal to each other, but the energy of the pulse a' is larger than that of the pulse b' as shown in FIG. 1C. As noted from FIG. 1C, the difference between the energies occurs in the range of high frequency, but the energies are generally equal in the range of audio frequency. Thus, it will be noted that if the time when the pulse a' is generated is not coincident with the center of the pulse b', then the positive and negative components fail to be completely offset, which causes the distortion or noise to occur. This also is true when the moving down from the upper bits to the lower bits occurs.

SUMMARY OF THE INVENTION

Accordingly, it is a principal object of the invention to provide a method of converting a digital signal into an analog signal adapted to have no distortion of the demodulated analog signal.

It is another object of the invention to provide a method of converting a digital signal into an analog signal adapted to have a higher speed of conversion.

It is further object of the invention to provide a digital-to-analog converter adapted to produce an analog signal having no distortion at a higher speed.

In accordance with one aspect of the invention, there is provided a method of converting a digital signal into an analog signal comprising the steps of;

signal, and digital signal consisting of upper and lower bit signals having a predetermined weight ratio, comprising the steps of:

converting said upper and lower bit signals into upper and lower pulse width signals, said upper pulse width signal varying in its pulse width corresponding to a data value of said upper bit signal relative to the center of the pulse width being at a fixed time position within a sampling period while said lower pulse width signal varies in its pulse width corresponding to a data value of said lower bit signal and the centers of each pulse width being at each pulse edge of said upper pulse width signal;

mixing said upper and lower pulse width signals corresponding to said weight ratio to form a composite signal;

and thereafter passing said composite signal through a smoothing filter to demodulate said digital signal into said analog signal.

In accordance with another aspect of the invention, there is provided a digital-to-analog converter for converting a digital signal into an analog signal, said digital signal consisting of upper and lower bit signals having a predetermined weight ratio, comprising:

an upper pulse width signal forming circuit to convert said upper bit signal into an upper pulse width signal varying in its pulse width corresponding to a data value of said upper bit signal relative to the center of the pulse width being at a fixed time position within a sampling period;

a lower pulse width signal forming circuit to convert said lower bit signal into a lower pulse width signal varying in its pulse width corresponding to a data value of said lower bit signal and the centers of each pulse width being at each edge of said upper pulse width signal;

a mixer circuit to mix said upper and lower pulse width signals corresponding to said weight ratio to form a composite signal;

and a filter circuit to smooth said composite signal to demodulate said digital signal into said analog signal.

BRIEF DESCRIPTION OF THE DRAWINGS

The above and other objects and features of the invention will be apparent from the description of the embodiment taken along with reference to the accompanying drawings in which.

DETAILED DESCRIPTION OF THE EMBODIMENT

Figure 1A:
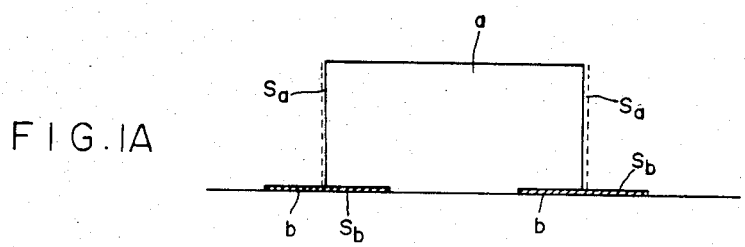
FIGS. 1A through 1C illustrate upper and lower pulse width signals.
Figure 1B:
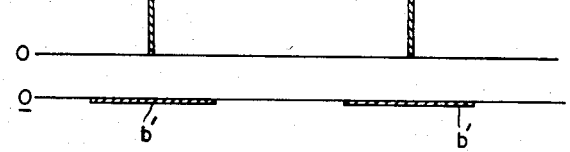
Figure 1C:
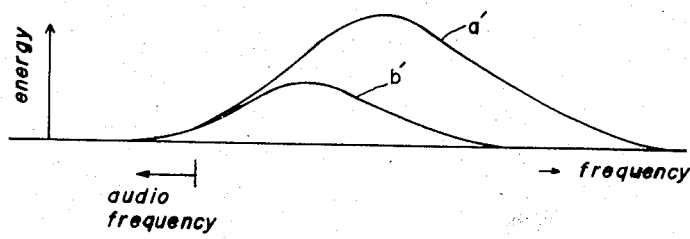
Figure 2:
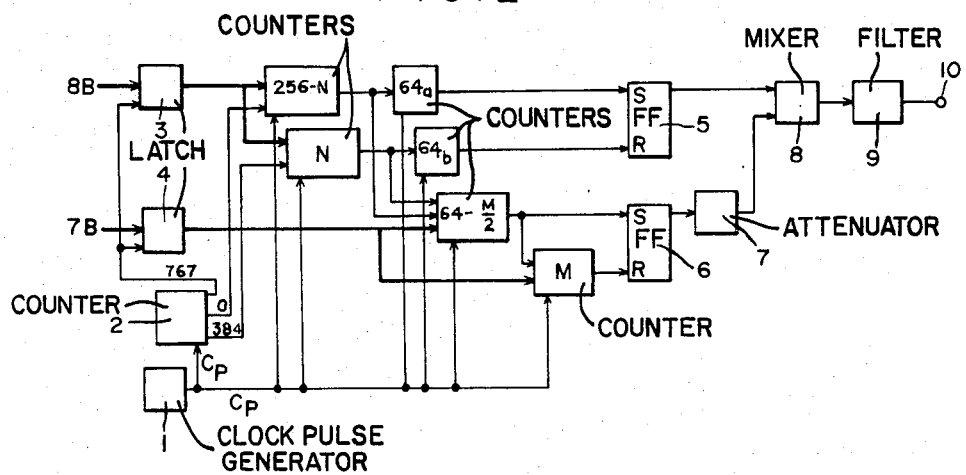
FIG. 2 is a schematic diagram of a digital-to-analog converter used for the invention.

In FIG. 2, a thick line shows a bundle of digital signal lines for a sampled digital signal. The sampled digital signal consists of 8 upper bits and 7 lower bits. One sampling period corresponds to the period during which a 768th (256×3) counter circuit 2 counts 768 clock pulses $C_p$ from a clock pulse generator 1 which may comprise a quartz crystal oscillator. A pair of latching circuits 3 and 4 are provided to store the sampled digital signal components of upper bits 8B and lower bits 7B, respectively. Counter circuits 256-N, N, 64a, 64b, 64—M/2 and M are provided as shown in FIG. 2. Upper and lower pulse width signal forming circuits comprise set-reset flip-flop circuits 5 and 6 (referred to as SR-FF circuits later), respectively. An attenuation circuit 7 is connected to the output of the SR-FF circuit 6 to attenuate the lower pulse width signal from the SR-FF circuit 6 in accordance with the weight of the lower bits relative to the upper bits. In this example, it should be noted that the degree of attenuation is 1/128. A mixer circuit 8 has inputs connected to the outputs of the SR-FF circuit 5 and the attenuation circuit 7. A smoothing filter circuit 9 has an input connected to the output of the mixer circuit 9 and is connected to an output terminal 10.

The operation of the converter of FIG. 2 will be described with reference to FIG. 3 in which the numbers attached to the clock pulses Cp indicate the number of pulses used for the expression of time in the following description. At a predetermined time of one sampling period, at time 767, for example, the digital signal components of upper bits 8B and lower bits 7B are divided and latched by the latching circuits 3 and 4. At time 0 of the next sampling period, the counter circuit 256-N begins to operate. The references "N" or "M" are defined as each data value of upper bits 8B or lower bits 7B indicated by decimal number. In this example, the data value for upper bits 8 varies from "0" to "255" while that for lower bits varies from "0" to "127". Provided that the upper bit 8B of 100 (N indicated at decimal) is latched by the latching circuit 3 while the lower bit 7B of 100 (M indicated at decimal) is latched by the latching circuit 4, the counter circuit 256-N counts 156(=256−100) clock pulses $C_p$ to terminate its operation at time 156. At that time, the counter circuits 64a and 64−M/2 begin to operate. The counter circuit 64a counts 64 clock pulses $C_p$ to terminate its operation at time 220(=156+64) while the counter circuit 64−M/2 counts 14 (=64−100/2) clock pulses $C_p$ to terminate its operation at time 170 (=156+14). The SR-FF circuit 6 is set at time 170 when the counter circuit 64−M/2 terminates its operation and reset when the counter circuit M which begins to operate at time 170 counts 100 clock pulses $C_p$ to terminate the operation of counter M at time 270 (=170+100) whereby a first pulse of a lower pulse width signal is produced. The SR-FF circuit 5 is set at time 220 when the counter circuit 64a terminates its operation and reset when the counter circuit 64b counts 64 clock pulses $C_p$ to terminate the operation of SR-FF circuit 5 at time 548 (=484+64) whereby an upper pulse width signal is produced. The counter circuit 64b begins to operate at time 484 (=384+100) when the counter circuit N, which begins to operate by a signal from the clock pulse generator 1 at time 384, counts 100 clock pulses $C_p$ to terminate the operation of counter N. At time 484 when the counter circuit N terminates its operation, the counter circuit 64—M/2 begins to operate again and counts 14 clock pulses $C_p$ to terminate its operation at time 498 (=484+14). Thus, the counter circuit M begins to operate again and the SR-FF circuit 6 is set at time 498 again and reset at time 598 (=498+100) when the counter circuit M terminates its operation whereby a second pulse of the lower pulse width signal is produced.

Figure 3:
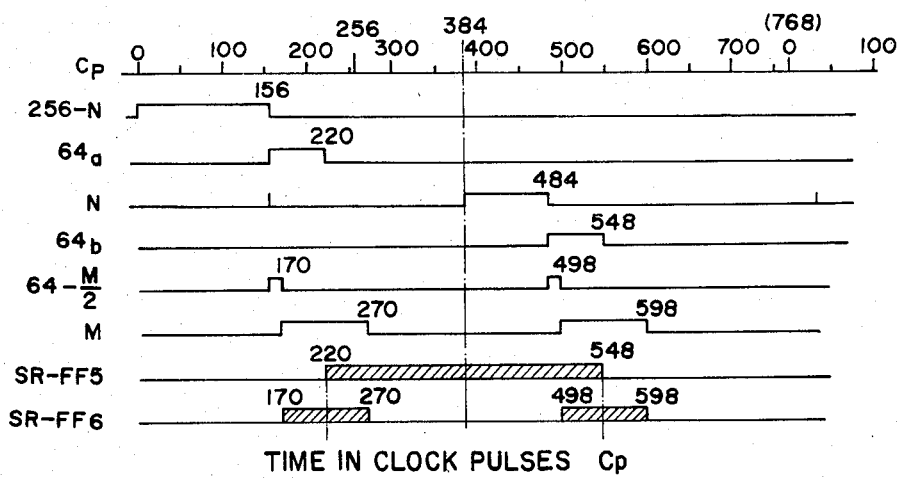
FIG. 3 is a time chart for illustration of the invention.

As noted from FIG. 3, the upper pulse width signal is produced with the center of its pulse width at a fixed time 384 within the sampling period, while the first and second pulses of the lower pulse width signals are produced with the center of each pulse width at each pulse edge of the upper pulse width signal. Such a relation between the upper and lower pulse width signals are never changed even though the values N and M which are the data values of the sampled upper and lower bits 8B and 7B are changed. Thus, it will be noted that the upper pulse width signal varies in its pulse width corresponding to the data value of the sampled upper bits relative to the center of the pulse width being at time 384, while the lower pulse width signals vary in their pulse width corresponding to the data value of the sampled lower bits and the centers of each pulse width being at each pulse edge of the upper pulse width signal.

In the embodiment of FIG. 2, in case that the data value M of the lower bits is odd, the value of M/2 has a fraction which is cancelled, but this presents no problem in practice. In the aforementioned embodiment, the pulse width of the upper pulse width signal becomes 384−(256−N)−64+N+64 which equals 128+2N and is determined by the sum of the value proportional to the data value N of the upper bits and the constant value 128, while the total pulse width of the lower pulse width signal becomes 2M. Thus, in case that M is zero, the output of the SR-FF circuit 6 is also zero. In practice, it should be noted that the pulse width of the lower pulse width signal is preferably determined by 2M+X (constant value of 1, for example) so that SR-FF circuit 6 provides an output in case M is zero because a better linearity can be obtained.

The upper pulse width signal is introduced directly into the mixer circuit 8 while the lower pulse width signal is attenuated as much as 1/128 by the attenuation circuit 8 and introduced into the mixer circuit 8. The mixer circuit 8 forms a composite signal of the upper pulse width signal and the attenuated lower pulse width signal. The composite signal passes through the filter circuit 9 to smooth it to thereby produce an analog signal at the output terminal thereof.

If it is required to make the demodulated analog signal from the output terminal of the circuit of the embodiment indentical to the original signal in the actual audio instruments, then this can be accomplished by well-known analog techniques such as a DC offset adjustment for the 128 pulses or gain adjustment for the two times the N and M, in an analog signal handling circuit (audio amplifier circuit, for example) which is operated after the D/A conversion.

Although one preferred embodiment of the invention has been described and illustrated with reference to the accompanying drawings, it will be understood by those skilled in the art that it is by way of example, and that various changes and modifications may be made without departing from the spirit and scope of the invention, which is intended to be defined only by the appended claims.

What is claimed is:

1. A method of converting a digital signal into an analog signal, said digital signal consisting of upper and lower bit signals having a predetermined weight ratio, comprising the steps of:

converting said upper and lower bit signals into upper and lower pulse width signals, said upper pulse width signal varying in its pulse width corresponding to a data value of said upper bit signal relative to the center of the pulse width being at a fixed time position within a sampling period, while said lower pulse width signal varies in its pulse width corresponding to a data value of said lower bit signal and the centers of each pulse width being at each pulse edge of said upper pulse width signal;

mixing said upper and lower pulse width signals corresponding to said weight ratio to form a composite signal;

and thereafter passing and composite signal through a smoothing filter to demodulate said digital signal into said analog signal.

2. A digital-to-analog converter for converting a digital signal into an analog signal, said digital signal consisting of upper and lower bit signals having a predetermined weight ratio, comprising:

an upper pulse width signal forming circuit to convert said upper bit signal into an upper pulse width signal varying in its pulse width corresponding to a data value of said upper bit signal relative to the center of the pulse width being at a fixed time position within a sampling period;

a lower pulse width signal forming circuit to convert said lower bit signal into a lower pulse width signal varying in its pulse width corresponding to a data value of said lower bit signal and the centers of each pulse width being at each edge of said upper pulse width signal;

a mixer circuit to mix said upper and lower pulse width signals corresponding to said weight ratio to form a composite signal;

and a filter circuit to smooth said composite signal to demodulate said digital signal into said analog signal.

3. A digital-to-analog converter as set forth in claim 2, further comprising a pair of latching circuits to store the upper and lower bit signals, wherein said upper and lower pulse width signal forming circuits comprise set-reset flip-flop circuits, and a plurality of counters being connected between said latching circuits and said set-reset flip-flop circuits.

* * * * *